(12) United States Patent  (10) Patent No.: US 8,156,804 B2
Sakai et al.  (45) Date of Patent: Apr. 17, 2012

(54) CAPACITIVE SEMICONDUCTOR SENSOR

(75) Inventors: Minekazu Sakai, Kariya (JP);
Michihiro Masuda, Anjo (JP);
Kimiharu Kayukawa, Nisshin (JP)

(73) Assignee: Denso Corporation, Kariya (JP)

( * ) Notice: Subject to any disclaimer, the term of this patent is extended or adjusted under 35 U.S.C. 154(b) by 1277 days.

(21) Appl. No.: 11/882,135

(22) Filed: Jul. 31, 2007

(65) Prior Publication Data

US 2008/0093740 A1  Apr. 24, 2008

(30) Foreign Application Priority Data

Oct. 18, 2006  (JP) ................................. 2006-283854

(51) Int. Cl.
G01P 1/02 (2006.01)
G01P 15/125 (2006.01)
H01L 29/00 (2006.01)

(52) U.S. Cl. ..................... 73/493; 73/514.32; 257/777

(58) Field of Classification Search ............... 73/514.32, 73/514.29, 514.36, 514.38, 493, 504.12, 73/504.14, 504.04; 257/777, 778, 686
See application file for complete search history.

(56) References Cited

U.S. PATENT DOCUMENTS

| 6,140,144 | A  | * | 10/2000 | Najafi et al. .................... 438/53 |
| 6,313,529 | B1 | * | 11/2001 | Yoshihara et al. ............. 257/724 |
| 6,430,999 | B2 | * | 8/2002 | Murata et al. ............... 73/514.36 |
| 6,502,462 | B2 | * | 1/2003 | Sakai ......................... 73/514.32 |
| 6,973,829 | B2 |   | 12/2005 | Sakai et al. |
| 7,069,789 | B2 | * | 7/2006 | Tokunaga et al. ................ 73/777 |
| 7,205,095 | B1 | * | 4/2007 | Prabhu et al. .................. 430/311 |
| 7,268,435 | B2 | * | 9/2007 | Ohta ................................. 257/777 |
| 7,327,004 | B2 | * | 2/2008 | Hattori et al. .................. 257/415 |
| 7,385,296 | B2 | * | 6/2008 | Ohta ................................ 257/784 |
| 7,678,589 | B2 | * | 3/2010 | Sakai et al. ....................... 438/15 |
| 7,762,134 | B2 | * | 7/2010 | Katsumata ................ 73/504.12 |
| 2004/0173913 | A1 |   | 9/2004 | Ohta |
| 2004/0182157 | A1 |   | 9/2004 | Sakai et al. |
| 2004/0238943 | A1 |   | 12/2004 | Fujii |
| 2005/0051910 | A1 |   | 3/2005 | Goto et al. |
| 2005/0275099 | A1 |   | 12/2005 | Takano |
| 2006/0097331 | A1 | * | 5/2006 | Hattori et al. .................. 257/414 |
| 2007/0090536 | A1 | * | 4/2007 | Sakai et al. ..................... 257/778 |
| 2008/0156095 | A1 |   | 7/2008 | Tsuji et al. |

FOREIGN PATENT DOCUMENTS

| JP | A-03-067177 | 3/1991 |
| JP | A-10-209162 | 8/1998 |
| JP | A-2004-247534 | 9/2004 |
| JP | A-2004-333133 | 11/2004 |

(Continued)

OTHER PUBLICATIONS

Office Action mailed Jan. 25, 2011 issued in corresponding JP patent application No. 2006-283854 (and English translation enclosed).
Office Action mailed Jul. 26, 2011from the Japan Patent Office in corresponding patent application No. 2006-283854 (and English translation).

*Primary Examiner* — Helen C. Kwok

(74) *Attorney, Agent, or Firm* — Posz Law Group, PLC

(57) ABSTRACT

A capacitive semiconductor sensor includes a sensor chip, a circuit chip, a plurality of bumps, and a plurality of dummy bumps. The sensor chip includes a dynamic quantity detector, which has a detection axis in one direction. The circuit chip includes a signal processing circuit. The sensor chip and the circuit chip are coupled by flip-chip bonding through the plurality of bumps. Furthermore, the sensor chip and the circuit chip are mechanically coupled through the plurality of dummy bumps.

14 Claims, 7 Drawing Sheets

FOREIGN PATENT DOCUMENTS

| | | |
|---|---|---|
| JP | A-2006-013074 | 1/2006 |
| JP | A-2006-047006 | 2/2006 |
| JP | A-2006-114529 | 4/2006 |

* cited by examiner

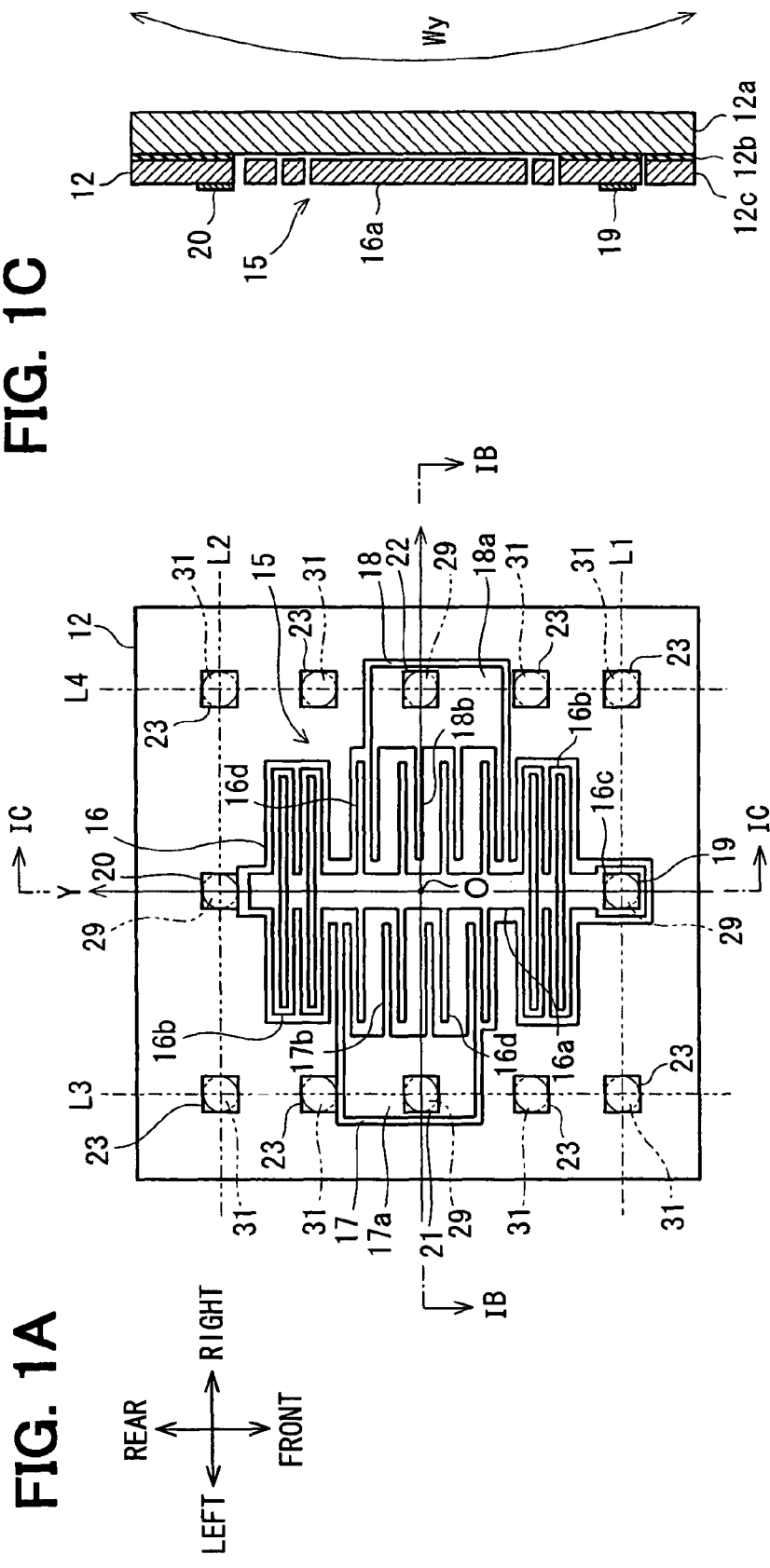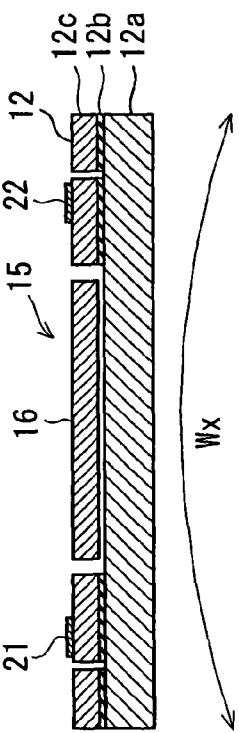

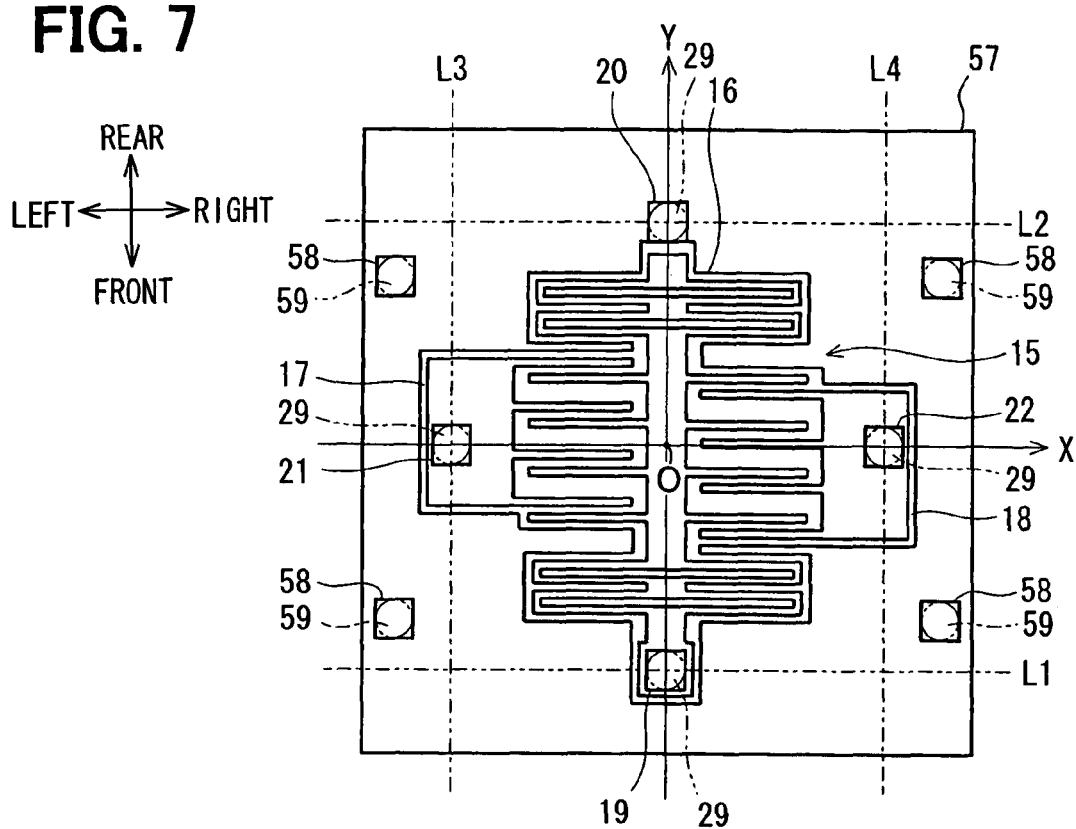

CAPACITIVE SEMICONDUCTOR SENSOR

CROSS REFERENCE TO RELATED APPLICATION

This application is based on Japanese Patent Application No. 2006-283854 filed on Oct. 18, 2006, the content of which is incorporated herein by reference in its entirety.

BACKGROUND OF THE INVENTION

1. Field of the Invention

The present invention relates to a capacitive semiconductor device for detecting a dynamic quantity as a change of capacitance.

2. Description of the Related Art

A capacitive semiconductor device is used for an acceleration sensor and a yaw rate sensor, for example. A semiconductor acceleration sensor for a vehicle air bag has a stack structure. In the stack structure, a sensor chip having an acceleration detector is mounted on a circuit chip having a signal processing circuit, and the circuit chip is mounted on a package made of a ceramic substrate. Conventionally, a bonding wire is used for electrical connections between the sensor chip and the circuit chip, and between the circuit chip and the package.

Instead of the bonding wire, a bump may be used for the connections between the sensor chip and the circuit chip, and between the circuit chip and the package, as disclosed in US 2004/0173913 A1 (corresponding to JP-A-2004-271312).

For example, as shown in FIG. 10A, a sensor chip 1 is arranged in a face down position against a circuit chip 2, and first electrode pads 1a of the sensor chip 1 are coupled with second electrode pads of the circuit chip 2 through first bumps 3. In this case, four first bumps 3 (electrode pads 1a) arranged at center portions of each side of the sensor chip 1. The circuit chip 2 is arranged in a face down position against a package 4 in a multi-chip module state, and third electrode pads 2a of the circuit chip 2 are coupled with electrode leads through second bumps 5. The electrode leads are disposed at the package 4.

The capacitive semiconductor sensor of US 2004/0173913 A1 is prevented from an affection of a parasitic capacitance at electrical connection parts (bumps 3) between the sensor chip 1 and the circuit chip 2, and a performance is improved. Furthermore, a mounting workability is improved, and a chip design becomes flexible.

However, the sensor chip 1 and the circuit chip 2 are electrically and mechanically coupled through only the four first bumps 3. Thus, the capacitive semiconductor sensor is relatively weak against an impact, thereby when the capacitive semiconductor sensor receives a high impact, the first bumps 3 may be injured.

SUMMARY OF THE INVENTION

In view of the foregoing problems, it is an object of the present invention to provide a capacitive semiconductor sensor in which a sensor chip is strongly coupled with a circuit chip.

According to an aspect of the invention, a capacitive semiconductor sensor includes a sensor chip, a circuit chip, a plurality of bumps, and a plurality of dummy bumps. The sensor chip includes a dynamic quantity detector, which has a detection axis in one direction. The circuit chip includes a signal processing circuit. The sensor chip and the circuit chip are coupled by flip-chip bonding through the plurality of bumps. Furthermore, the sensor chip and the circuit chip are mechanically coupled through the plurality of dummy bumps.

A number of connection parts between the sensor chip and the circuit chip is increased by the plurality of dummy bumps, thereby the sensor chip and the circuit chip is strongly coupled. In addition, the sensor chip is attached to the circuit chip by the dummy bumps at the same time when they are attached by the bumps. Therefore, another process for providing dummy pumps is not required.

According to another aspect of the invention, a capacitive semiconductor sensor includes a sensor chip, a circuit chip, a plurality of bumps, and a plurality of dummy bumps. The sensor chip includes a dynamic quantity detector, which has a detection axis in one direction. The circuit chip includes a signal processing circuit. The sensor chip and the circuit chip are coupled by flip-chip bonding through the plurality of bumps. Furthermore, the sensor chip and the circuit chip are mechanically coupled through the plurality of dummy bumps. The plurality of bumps includes first to fourth bumps, in which the first and second bumps are arranged in a direction of the detection axis so that an approximately center portion of the dynamic quantity detector is located between the first bump and the second bump, and the third and fourth bumps are arranged in a direction approximately perpendicular to the detection axis so that an approximately center portion of the dynamic quantity detector is located between the third bump and the fourth bump. The plurality of dummy bumps includes first to eighth dummy bumps. The first to fourth dummy bumps are arranged at four corners of a quadrangle having first to fourth sides. Each of the first to fourth bumps is located at an approximately center portion of each of the first to fourth sides of the quadrangle. Furthermore, the fifth and sixth dummy bumps are arranged at approximately center portions between the third bump and the two corners on the third side of the quadrangle, and the seventh and eighth dummy bumps are arranged at approximately center portions between the fourth bump and the two corners on the fourth side of the quadrangle.

Also in this case, a number of connection parts between the sensor chip and the circuit chip is increased by the plurality of dummy bumps, thereby the sensor chip and the circuit chip is strongly coupled. In addition, the sensor chip is attached to the circuit chip by the dummy bumps at the same time when they are attached by the bumps. Therefore, another process for providing dummy pumps is not required.

BRIEF DESCRIPTION OF THE DRAWINGS

Additional objects and advantages of the present invention will be more readily apparent from the following detailed description of preferred embodiments when taken together with the accompanying drawings. In the drawings:

FIG. 1A is a schematic plan view of a sensor chip according to a first embodiment of the invention, and FIGS. 1B and 1C are cross-sectional views of the sensor chip taken along line IB-IB or IC-IC in FIG. 1A;

FIG. 7 is a schematic plan view of a sensor chip according to a sixth embodiment of the invention;

FIG. 8 is a schematic plan view of a sensor chip according to a seventh embodiment of the invention;

DETAILED DESCRIPTION OF THE PREFERRED EMBODIMENTS (First Embodiment)

A capacitive semiconductor device according to a first embodiment of the invention can be used for a semiconductor acceleration sensor 11 of a vehicle air bag system (i.e., for detecting an impact), for example.

Figure 2:
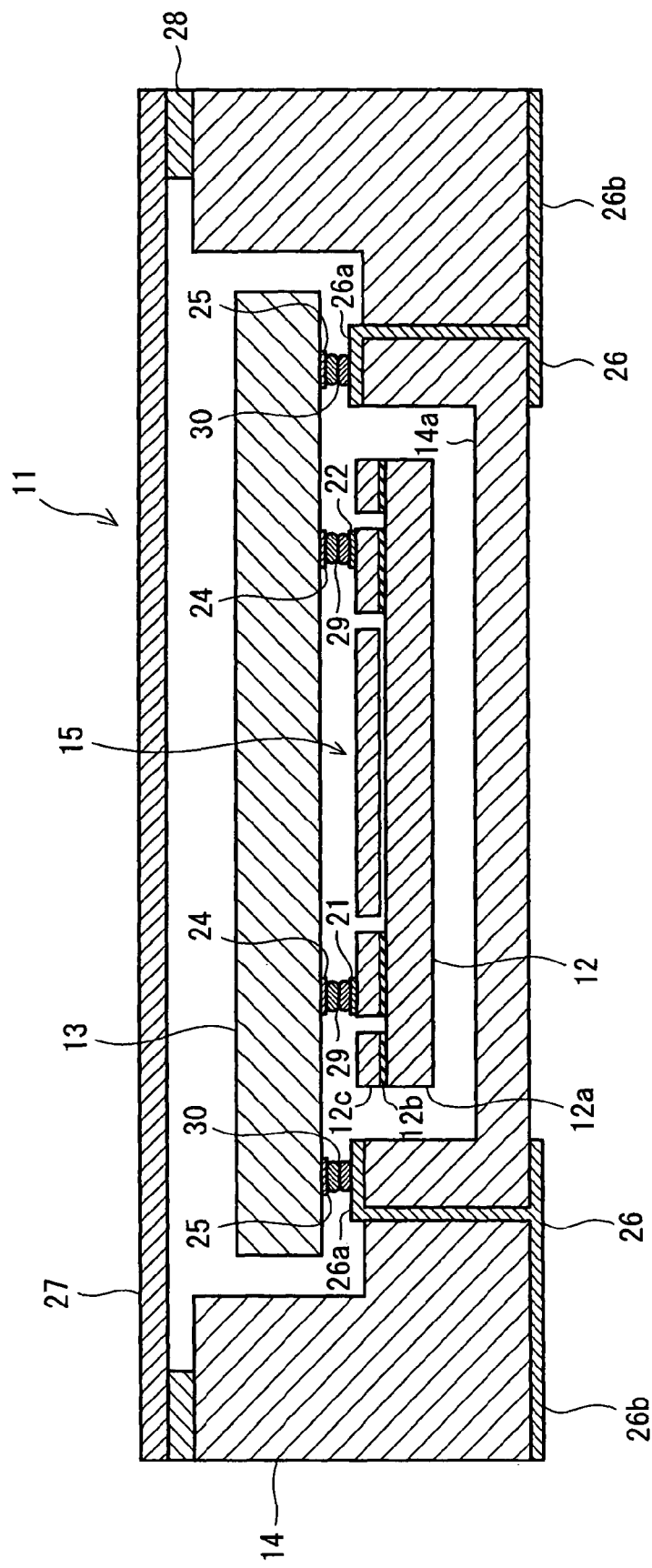
FIG. 2 is a cross-sectional view of a semiconductor acceleration sensor according to the first embodiment.

As shown in FIG. 2, the semiconductor acceleration sensor 11 has a stack structure in which a sensor chip 12 is mounted on a circuit chip 13. The stack structure is disposed in a package 14 which is made of a ceramic, for example.

As shown in FIGS. 1B and 1C, the sensor chip 12 has an approximately rectangular shape (square shape), and has a SOI (silicon on insulator) substrate as a base. The SOI substrate has a single-crystalline silicon layer 12c disposed on a supporting substrate 12a, through an insulation layer (oxide layer) 12b. The supporting substrate 12a is made of silicon, for example. The single-crystalline silicon layer 12c has grooves formed with a micro-machining technique. The grooves form an acceleration detector 15 as a dynamic quantity detector. The acceleration detector 15 is arranged at an approximately rectangular-shaped area which is located at an approximately center portion of the sensor chip 12.

The acceleration detector 15 detects acceleration in a front-rear direction of a vehicle (i.e., a direction of a Y-axis in FIG. 1A), and has a detection axis (Y-axis) in one direction. In FIG. 1A, an approximately center portion of the acceleration detector 15 is set to be an origin O, the front-rear direction (detection axis) is set to be the Y-axis, and a right-left direction approximately perpendicular to the Y-axis is set to be a X-axis.

The acceleration detector 15 has a movable electrode part 16 which displaces in accordance with acceleration, a first fixed electrode part 17 and a second fixed electrode 18. The first fixed electrode part 17 is arranged on a left side of the movable electrode part 16, and the second fixed electrode 18 is arranged on a right side of the movable electrode part 16. The movable electrode part 16 has a spindle part 16a, beam parts 16b, an anchor part 16c, and a plurality of movable electrodes 16d. The spindle part 16a is arranged at an approximately center portion of the movable electrode part 16, and extends to the direction of the Y-axis. The beam parts 16b have rectangular-frame shapes extending to the direction of the X-axis, and are arranged at front and rear ends of the spindle part 16a. The anchor part 16c is arranged at a front side of the beam part 16b which is arranged at the front end of the spindle part 16a. The movable electrodes 16d have narrow band shapes, and respectively extend from the spindle part 16a to the right or left side.

On an upper surface of the anchor part 16c, a first electrode pad 19 is disposed. A second electrode pad 20 is disposed in an upper surface of a frame area surrounding the acceleration detector 15 on an opposite side of the first electrode pad 19 with respect to the origin O. The insulation layer 12b under the movable electrode part 16 is removed except for a portion under the anchor part 16c. Therefore, the movable electrode part 16 is in a cantilevered floating state in which only the anchor part 16c is supported by the supporting substrate 12a.

The first fixed electrode part 17 has a first base part 17a and a plurality of first fixed electrodes 17b. The first base part 17a has an approximately rectangular shape, and is arranged on the left side of the origin O. The first fixed electrodes 17b have narrow band shapes, and extend from the first base part 17a to the right side. Each of the first fixed electrodes 17b is arranged on a slightly rear side of each of the movable electrodes 16d, so that each of the first electrodes 17b is adjacent to and approximately parallel to each of the movable electrodes 16d, and has a small gap with each of the movable electrodes 16d. On an upper surface of the first base part 17a, a third electrode pad 21 is disposed.

The second fixed electrode part 18 has a second base part 18a and a plurality of second fixed electrodes 18b. The second base part 18a has an approximately rectangular shape, and is arranged on the right side of the origin O. The second fixed electrodes 18b have narrow band shapes, and extend from the second base part 18a to the left side. Each of the second fixed electrodes 18b is arranged on a slightly front side of each of the movable electrodes 16d, so that each of the second electrodes 18b is adjacent to and approximately parallel to each of the movable electrodes 16d, and has a small gap with each of the movable electrodes 16d. A fourth electrode pad 22 is disposed on an upper surface of the second base part 18a (i.e., an opposite side of the third electrode pad 21 with respect to the origin O).

Thereby, the movable electrode part 16 (the movable electrodes 16d) and the first fixed electrode part 17 (the first fixed electrodes 17b), and the movable electrode part 16 (the movable electrodes 16d) and the second fixed electrode part 18 (the second fixed electrodes 18b) form capacitors. The movable electrode part 16 displaces in accordance with the acceleration, and capacitances of the capacitors are changed in accordance with a displacement of the movable electrode part 16. Thus, the acceleration detector 15 detects the acceleration as a change of the capacitances.

The electrode pads 19, 20, 21, and 22 have approximately quadrangle shapes, and are made of aluminum, for example. On a surface of the sensor chip 12, a plurality of first dummy pads 23 is disposed apart from the electrode pads 19, 20, 21, and 22.

The circuit chip 13 has an approximately rectangular plate shape larger than sensor chip 12. The circuit chip 13 has a signal processing circuit (not shown) for operating a signal from the acceleration detector 15 of the sensor chip 12. The signal processing circuit includes a capacitance-voltage converter, a filter, and a signal amplifier, in order to convert the change of the capacitances into a change of voltage and amplify the change of voltage to be a predetermined value. As shown in FIG. 2, the sensor chip 12 is mounted on a mount area, i.e., an approximately center portion of a lower surface of the circuit chip 13.

In the mount area of the circuit chip 13, fifth electrode pads 24 and second dummy pads (not shown) are disposed corresponding to the electrode pads 19-22 and the first dummy pads 23, and are coupled with them. In a right side and a left side of the lower surface of the circuit chip 13, sixth electrode pads 25 are disposed for coupling the circuit chip 13 to the package 14. The circuit chip 13 further includes a test circuit.

The package 14 is made of a multiple layer ceramic substrate, for example, and is formed into an approximately thin rectangular container. The package 14 has a concave part 14a at an approximately center portion of a bottom part thereof. The sensor chip 12 is located in the concave part 14a. The package 14 has wires 26 which include a plurality of coupling electrodes 26a corresponding to the sixth electrode pads 25 of the circuit chip 13. The wires 26 further include coupling parts 26b which are disposed at an outer surface of the bottom part of the package 14 to be coupled with an outside. A cover 27 is brazed at an upper opening part of the package 14 with a wax 28 made of silver, for example, so that the package 14 becomes airproof.

As shown in FIG. 2, the sensor chip 12 is coupled with the circuit chip 13 in a face down position (i.e., flip chip method) through first to fourth bumps 29. The first to fourth bumps 29 are respectively disposed between the first to fourth electrode pads 19-22 of the sensor chip 12 and the fifth electrode pads 24 of the circuit chip 13. In this way, the sensor chip 12 is electrically and mechanically coupled with the circuit chip 13 by bump connections, thereby the sensor chip 12 and the circuit chip 13 form a multi chip module.

The circuit chip 13 forming the multi chip module is coupled with the package 14 in a face down position (i.e., flip chip method) through four bumps 30. The four bumps 30 are respectively disposed between the sixth electrode pads 25 of the circuit chip 13 and the coupling electrodes 26a of the package 14. In this way, the circuit chip 13 is mechanically and electrically coupled with the package 14. The bumps 29 and 30 may be made of solder or gold, for example.

Between the sensor chip 12 and the circuit chip 13, eight dummy bumps 31 are disposed apart from the first to fourth bumps 29, as shown in FIG. 1A. The eight dummy bumps 31 are respectively disposed between the first dummy pads 23 on the sensor chip 12 and the second dummy pads on the circuit chip 13. The first dummy pads 23 and the dummy bumps 31 are arranged as shown in FIG. 1A.

Specifically, first to fourth lines L1-L4 are set on the surface of the sensor chip 12. The first line L1 is parallel to the X-axis and passes through the first electrode pad 19 (the first bumps 29). The second line L2 is parallel to the X-axis and passes through the second electrode pad 20 (the second bumps 29). The third line L3 is parallel to the Y-axis and passes through the third electrode pad 21 (the third bumps 29). The fourth Line L4 is parallel to the Y-axis and passes through the fourth electrode pad 22 (the fourth bumps 29). Thus, the lines L1-L4 form an approximately quadrangle (square) shape. Each of the electrodes pads 19-22 is located at an approximately center portion of each sides of the quadrangle shape.

Four of the first dummy pads 23 are arranged at corners of the quadrangle shape. Along the third line L3, other two of the first dummy pads 23 are arranged at approximately center portions between the two corners of the quadrangle shape and the third electrode pad 21. Further, along the fourth line L4, the other two of the first dummy pads 23 are arranged at approximately center portions between the two corners of the quadrangle shape and the fourth electrode pad 22. The eight dummy bumps 31 are arranged on each of the first dummy pads 23.

The electrode pads 19-22 (four bumps 29) and the first dummy pads 23 (eight dummy bumps 31) are approximately line symmetry with respect to the Y-axis, and approximately point symmetry with respect to the origin O. In this case, a total amount $\Sigma X$ of distances from the origin O to the bumps 29 and the dummy bumps 31 in the direction of the X-axis is set to be longer than a total amount $\Sigma Y$ of those in the direction of the Y-axis.

The circuit chip 13 has the second dummy pads (not shown) arranged at corresponding portions with the first dummy pads 23 of the sensor chip 12. The circuit chip 13 has the test circuit for checking an electric property (e.g., electric resistance between two of the dummy bumps 31) between the plurality of dummy bumps 31 by supplying electricity from an outside.

Before attaching the sensor chip 12 to the circuit chip 13, the first to fourth bumps 29 and the dummy bumps 31 may be formed on each of the fifth electrode pads 24 and the second dummy pads by plating or as stud bumps by flip chip bonder at the same time. As a method for attaching the sensor chip 12 to the circuit chip 13, an ultrasonic compression bonding, a thermal compression bonding, or a reflow method may be used, for example. When the circuit chip 13 is attached to the package 14, a similar method may be used.

In the semiconductor acceleration sensor 11 in FIGS. 1A-2, the sensor chip 12 and the circuit chip 13 are electrically and mechanically coupled by the four bumps 29, and furthermore, mechanically coupled by the eight dummy bumps 31. Therefore, the sensor chip 12 and the circuit chip 13 are strongly coupled.

In addition, the sensor chip 12 are attached to the circuit chip 13 by the dummy bumps 31 at the same time they are attached by the bumps 29, thereby another process for providing dummy pumps 31 is not required. Furthermore, the bumps 29 and the dummy bumps 31 are arranged so that the sensor chip 12 and the circuit chip 13 are mechanically coupled in a balanced manner.

The sensor chip 12 is fixed to the circuit chip 13 by the bumps 29 and the dummy bumps 31. The sensor chip 12 may be warped due to a thermal stress. When the sensor chip 12 is warped in the direction of the detection axis (Y-axis) as shown by the arrow Wy in FIG. 1C, distances between the movable electrode 16 and the fixed electrodes 17 and 18 are changed, thereby a sensor output is changed. Thus, a detection accuracy of the semiconductor acceleration sensor 11 is reduced. In contrast, when the sensor chip 12 is warped in the direction perpendicular to the detection axis (i.e., X-axis) as shown by the arrow Wx in FIG. 1B, the sensor output is less affected.

As shown in FIG. 1A, the dummy bumps 31 are arranged at the four corners of the quadrangle shape, and along the third line L3 and the fourth line L4 so that the total amount $\Sigma X$ of the distances from the origin O to the bumps 29 and the dummy bumps 31 in the direction of the X-axis is longer than the total amount $\Sigma Y$ of those in the direction of the Y-axis. Thus, the bumps 29 and the dummy bumps 31 are relatively close from the origin O in the direction of the Y-axis, and relatively far from the origin O in the direction of the X-axis, i.e., the sensor chip 12 is fixed to the circuit chip 13 at positions which are relatively close from the origin O in the direction of the Y-axis, and relatively far from the origin O in the direction of the X-axis. Therefore, when the sensor chip 12 is warped due to a thermal stress, a warp is occurred not in the direction of the Y-axis (detection axis) but in the direction of the X-axis. As a result, the semiconductor acceleration sensor 11 has a high detection accuracy, without an affection of the warp of the sensor chip 12.

Furthermore, the circuit chip 13 has the test circuit for measuring the electric resistance between the dummy bumps 31 by supplying electricity between the dummy bumps 31 from the outside. Thus, the electric resistance between the dummy bumps 31 is easily measured at an appropriate time, thereby a connection trouble of the dummy bumps 31 and a connection trouble of the bumps 29 are easily detected. For example, when the electric resistance between two of the dummy bumps 31 is within a normal range, the dummy bumps 31 and the bumps 29 are determined to be normal. In contrast, when the electric resistance between two of the dummy bumps 31 increases unusually, the dummy bumps 31 are determined to have a problem such as a detachment.

As described above, the sensor chip 12 is coupled with the circuit chip 13 by flip chip bonding through the dummy bumps 31 in addition to the bumps 29. Thus, the sensor chip 12 and the circuit chip 13 are strongly coupled, and can resist a high impact. Furthermore, the bumps 29 and the dummy bumps 31 are arranged in a balanced manner, thereby the affection of the warp of the sensor chip 12 is reduced.

(Second Embodiment)

Figure 3:
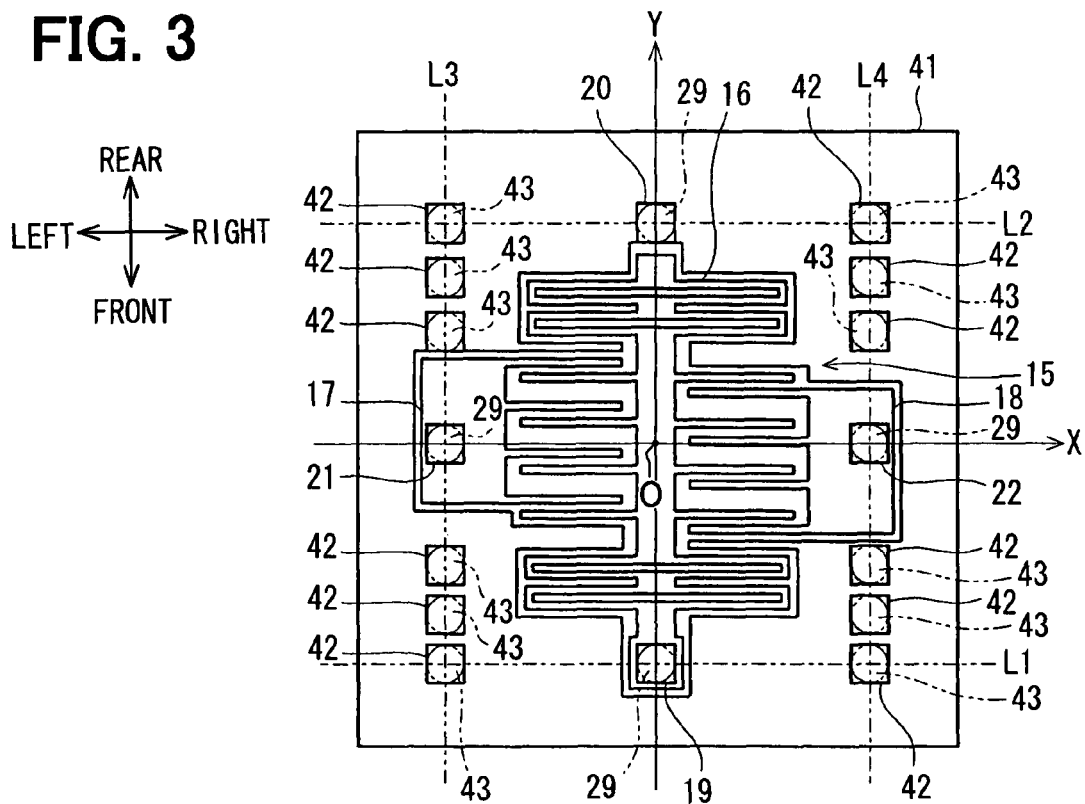
FIG. 3 is a schematic plan view of a sensor chip according to a second embodiment of the invention.

A semiconductor acceleration sensor 11 according to a second embodiment of the invention has a sensor chip 41. As shown in FIG. 3, the sensor chip 41 has twelve dummy bumps 43 (twelve first dummy pads 42) which are arranged differently with those of the sensor chip 12 in FIG. 1A. Other parts of the sensor chip 41 are similar with those of the sensor chip 12.

The sensor chip 41 has the acceleration detector 15 arranged at an approximately rectangular-shaped area which is located at an approximately center portion of the sensor chip 41. The acceleration detector 15 includes the movable electrode part 16, the first fixed electrode part 17, and the second fixed electrode part 18. The sensor chip 41 also has the first to fourth electrode pads 19-22. On an upper surface of the sensor chip 41, the twelve first dummy pads 42 are arranged. The sensor chip 41 and a circuit chip (not shown) are electrically and mechanically coupled through four bumps 29, and furthermore, mechanically coupled through the twelve dummy bumps 43.

In this case, four of the first dummy pads 42 are arranged at the corners of the quadrangle shape formed by the line L1-L4. In addition, other four of the first dummy pads 42 are arranged along the line L3, and the other four of the first dummy pads 42 are arranged along the line L4. The electrode pads 19-22 (four bumps 29) and the first dummy pads 42 (twelve dummy bumps 43) are arranged to be approximately line symmetry with respect to the Y-axis, and approximately point symmetry with respect to the origin O. Furthermore, a total amount ΣX of the distances from the origin O to the bumps 29 and the dummy bumps 43 in the direction of the X-axis is longer than a total amount ΣY of those in the direction of the Y-axis.

(Third Embodiment)

Figure 4:
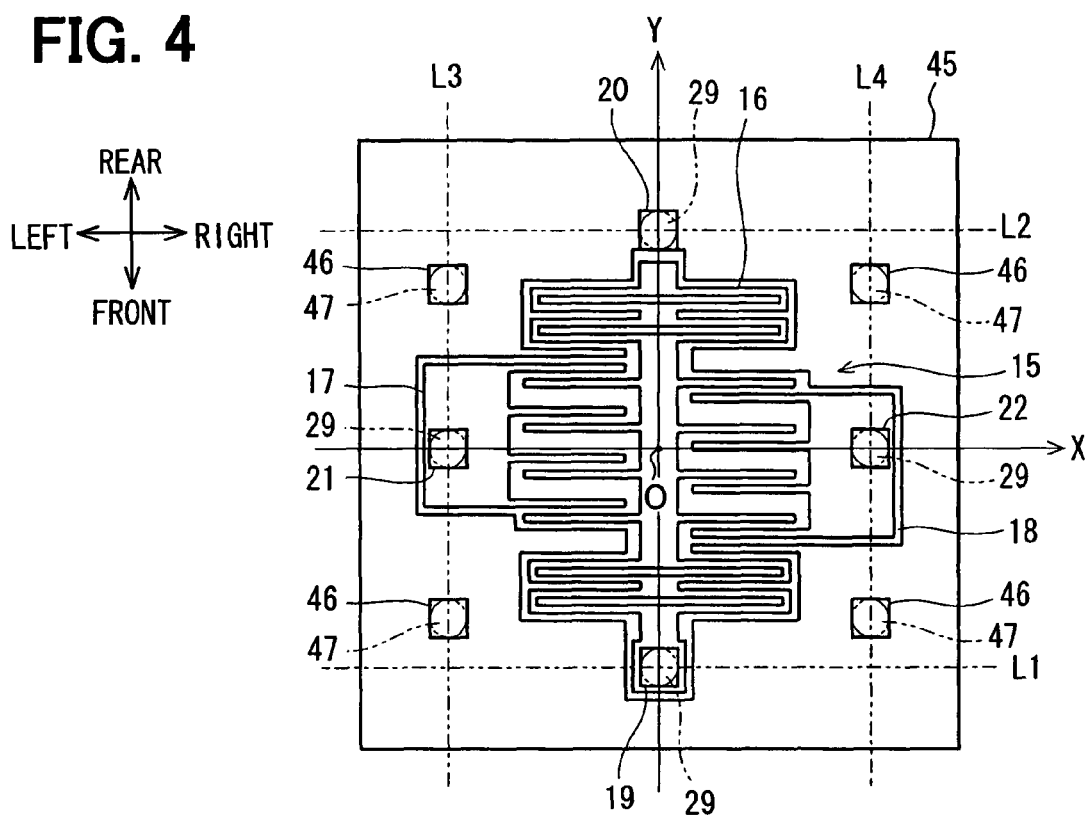
FIG. 4 is a schematic plan view of a sensor chip according to a third embodiment of the invention.

A semiconductor acceleration sensor 11 according to a third embodiment of the invention has a sensor chip 45. As shown in FIG. 4, the sensor chip 45 has four first dummy pads 46 and four dummy bumps 47 which are provided on an upper surface of the sensor chip 45 and are arranged in a region between the line L1 and the line L2. Two of the first dummy pads 46 are arranged along the line L3, and other two of the first dummy pads 46 are arranged along the line L4. Also in this case, the electrode pads 19-22 (four bumps 29) and the first dummy pads 46 (four dummy bumps 47) are arranged to be approximately line symmetry with respect to the Y-axis, and approximately point symmetry with respect to the origin O. Furthermore, a total amount ΣX of the distances from the origin O to the bumps 29 and the dummy bumps 47 in the direction of the X-axis is longer than a total amount ΣY of those in the direction of the Y-axis.

(Fourth Embodiment)

Figure 5:
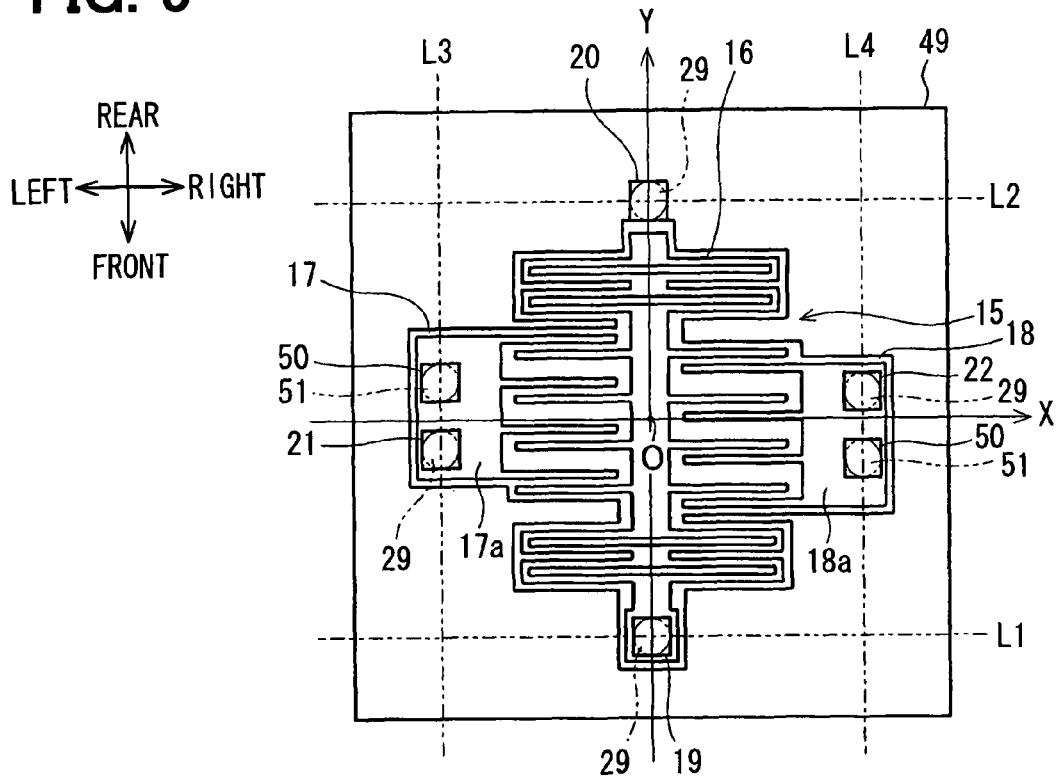
FIG. 5 is a schematic plan view of a semiconductor chip according to a fourth embodiment of the invention.

A semiconductor acceleration sensor 11 according to a fourth embodiment of the invention has a sensor chip 49. As shown in FIG. 5, the sensor chip 49 has two first dummy pads 50 and two dummy bumps 51. The third electrode pad 21 and one of the first dummy pads 50 are disposed at the first base part 17a of the first fixed electrode part 17 to be arranged along the third line L3. In addition, the fourth electrode pad 22 and the other one of the first dummy pads 50 are disposed at the second base part 18a of the second fixed electrode part 18 to be arranged along the line L4.

Also in this case, the electrode pads 19-22 (four bumps 29) and the first dummy pads 50 (two dummy bumps 51) are arranged to be approximately line symmetry with respect to the Y-axis, and approximately point symmetry with respect to the origin O. Furthermore, a total amount ΣX of the distances from the origin O to the bumps 29 and the dummy bumps 51 in the direction of the X-axis is longer than a total amount ΣY of those in the direction of the Y-axis.

(Fifth Embodiment)

Figure 6:
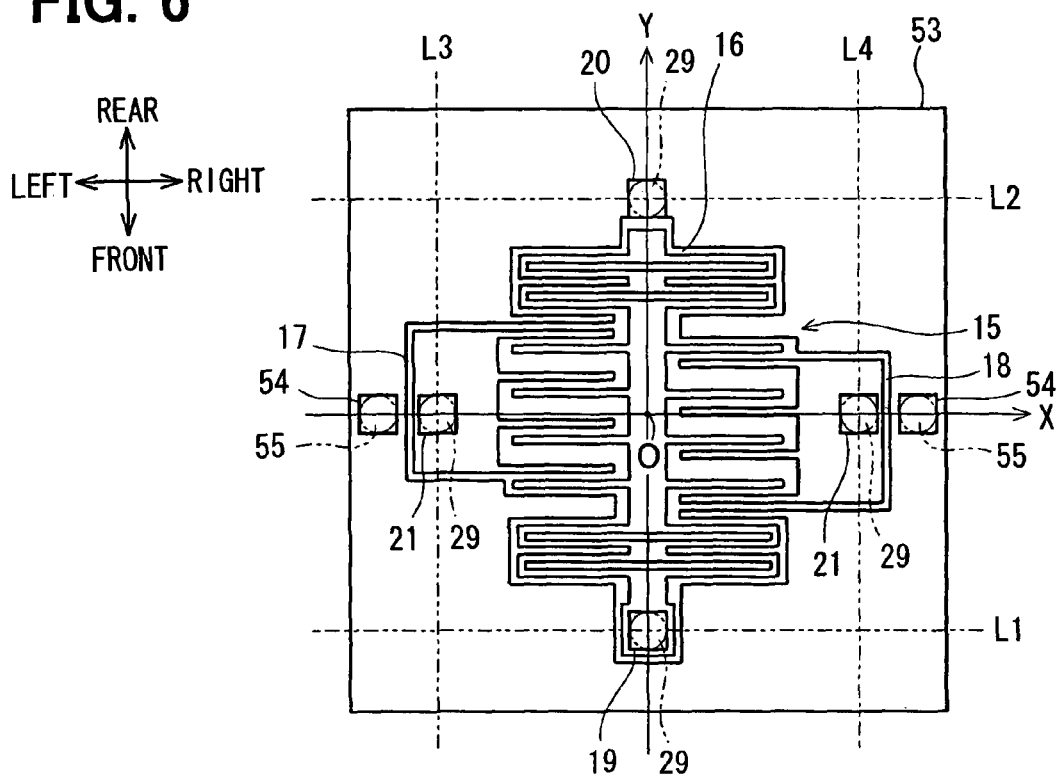
FIG. 6 is a schematic plan view of a sensor chip according to a fifth embodiment of the invention.

A semiconductor acceleration sensor 11 according to a fifth embodiment of the invention has a sensor chip 53. As shown in FIG. 6, the sensor chip 53 has two first dummy pads 54 and two dummy bumps 55. One of the first dummy pads 54 is arranged at an outside of the third electrode pad 21, i.e., at an approximately center portion of a left side of the sensor chip 53 and an outside of the quadrangle shape). In addition, the other one of the first dummy pads 54 is arranged at an outside of the fourth electrode pad 21, i.e., at an approximately center portion of a right side of the sensor chip 53.

Also in this case, the electrode pads 19-22 (four bumps 29) and the first dummy pads 54 (two dummy bumps 55) are arranged to be approximately line symmetry with respect to the Y-axis, and approximately point symmetry with respect to the origin O. Furthermore, a total amount ΣX of the distances from the origin O to the bumps 29 and the dummy bumps 55 in the direction of the X-axis is longer than a total amount ΣY of those in the direction of the Y-axis.

(Sixth Embodiment)

A semiconductor acceleration sensor 11 according to a sixth embodiment of the invention has a sensor chip 57. As shown in FIG. 7, the sensor chip 57 has four first dummy pads 58 and four dummy bumps 59. The four dummy pads 58 are arranged at front and rear portions of a right side of the sensor chip 57, and front and rear portions of a left side of the sensor chip 57. The front and rear portions are located between the first line L1 and the second line L2, and are also located at outsides of the quadrangle shape.

Also in this case, the electrode pads 19-22 (four bumps 29) and the first dummy pads 58 (four dummy bumps 59) are arranged to be approximately line symmetry with respect to the Y-axis, and approximately point symmetry with respect to the origin O. Furthermore, a total amount ΣX of the distances from the origin O to the bumps 29 and the dummy bumps 59 in the direction of the X-axis is longer than a total amount ΣY of those in the direction of the Y-axis.

In the second to sixth embodiments, the sensor chip 41, 45, 49, 53, and 57 and the circuit chip (not shown) are strongly coupled through a plurality of the dummy bumps 43, 47, 51, 55, and 59, in addition to the bumps 29. Therefore, the semiconductor acceleration sensor 11 can resist a high impact. Furthermore, the bumps 29 and the dummy bumps 43, 47, 51, 55, 59 are arranged in balanced manners, thereby affections of warps of the sensor chips 41, 45, 49, 53, and 57 are reduced.

(Seventh Embodiment)

A semiconductor acceleration sensor 11 according to a seventh embodiment of the invention has a sensor chip 61. The sensor chip 61 has an acceleration detector 62 as a dynamic quantity detector. As shown in FIG. 8, the acceleration detector 62 is arranged in an approximately rectangular-shaped area shown by the dotted line which is slightly shifted to a rear side from a center portion of the sensor chip 61.

The acceleration detector 62 has the movable electrode part 16, a third fixed electrode part 63, and a fourth fixed electrode part 64. The movable electrode part 16 has the spindle part 16a, the beam parts 16b, the anchor part 16c, and the movable electrodes 16d. The first electrode pad 19 is arranged on the upper surface of the anchor part 16c, i.e., an approximately center portion of a front side of the sensor chip 61. In the sensor chip 61, one electrode pad which is arranged at a rear side portion of the movable electrode part 16 (i.e., the second electrode pad 20 in the sensor chip 12, 41, 45, 49, 53, and 57) is not required.

The third fixed electrode part 63 has a third base part 63a, a plurality of third fixed electrodes 63b, and a third fixed electrode wire 63c. The third base part 63a has an approximately rectangular shape, and is arranged on the left side of the origin O. The third fixed electrodes 63b have narrow band shapes, and extend from the third base part 17a to the right side. The fixed electrode wire 63c extends from the third base part 63a to a front side. The fourth fixed electrode part 64 has a fourth base part 64a, a plurality of fourth fixed electrodes 64b, and a fourth fixed electrode wire 64c. The fourth base part 64a has an approximately rectangular shape, and is arranged on the right side of the origin O. The fourth fixed electrodes 64b have narrow band shapes, and extend from the fourth base part 64a to the left side. The fourth fixed electrode wire 64c extends from the fourth base part 64a to the front side.

An electrode pad 65 is arranged on an upper surface of a front end of the third fixed electrode wire 63a, an electrode pad 66 is arranged on an upper surface of a front end of the fourth fixed electrode wire 64c. Thus, the three electrode pads 19, 65, and 66 are arranged in the front side of the sensor chip 61. The three electrode pads 19, 65, and 66 are coupled with a circuit chip (not shown) through bumps 67.

In the sensor chip 61, eight first dummy pads 68 (dummy bumps 69) are arranged in other side. Specifically, three of the first dummy pads 68 (dummy bumps 69) are arranged backward and forward in the right side and the left side of the sensor chip 61, respectively. In the rear side of the sensor chip 61, the other two of the first dummy pads 68 (dummy bumps 69) are arranged on a right side and a left side with respect to the Y-axis.

Also in this case, the electrode pads 19, 65 and 66 (bumps 67) and the first dummy pads 68 (dummy bumps 69) are arranged to be approximately line symmetry with respect to the Y-axis. Furthermore, a total amount ΣX of the distances from the origin O to the bumps 67 and the dummy bumps 69 in the direction of the X-axis is longer than a total amount ΣY of those in the direction of the Y-axis.

The sensor chip 61 and the circuit chip (not shown) are strongly coupled through the plurality of dummy bumps 69, in addition to the bumps 67. Therefore, the semiconductor acceleration sensor 11 can resist a high impact. Furthermore, the bumps 67 and the dummy bumps 69 are arranged in a balanced manner, thereby an affection of a warp of the sensor chip 61 is reduced.

(Eighth Embodiment)

Figure 9:
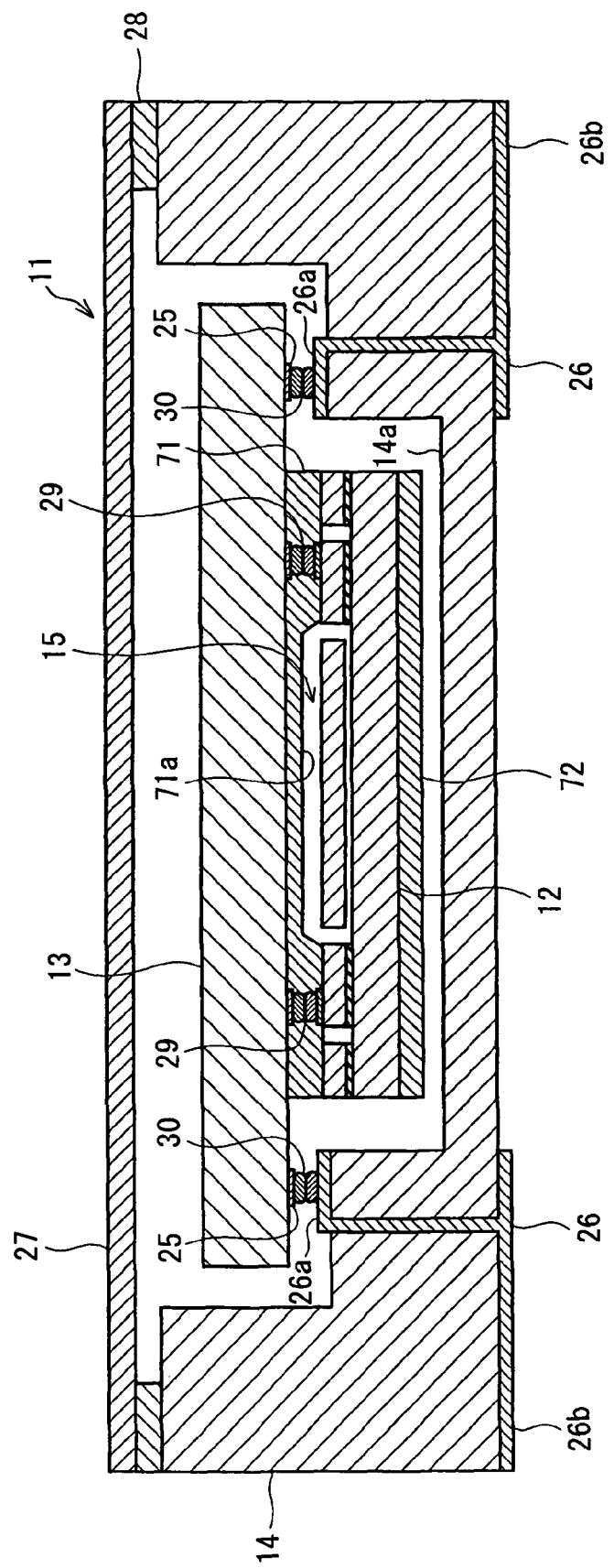
FIG. 9 is a cross-sectional view of a semiconductor acceleration sensor according to an eighth embodiment.
Figure 10A:
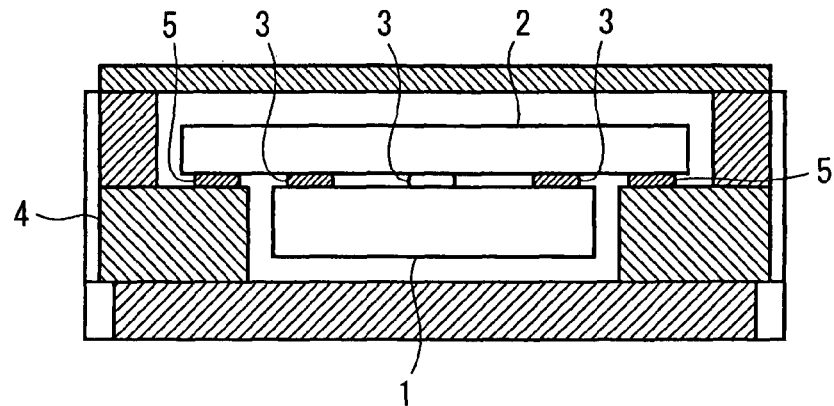
FIG. 10A is a cross-sectional view of a semiconductor acceleration sensor according to a prior art.
Figure 10B:
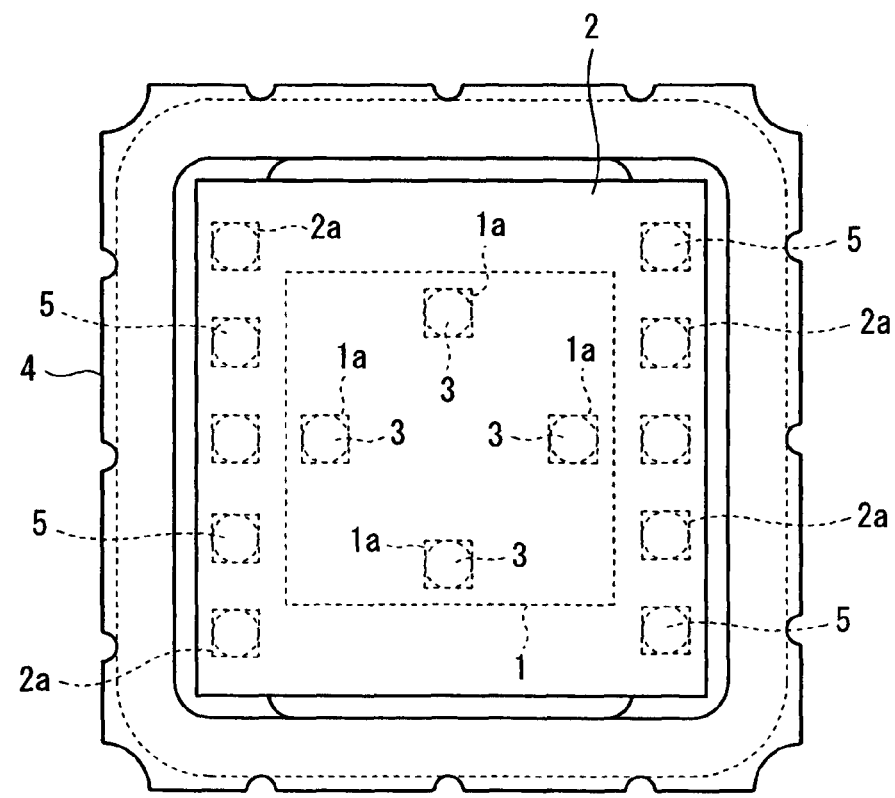
FIG. 10B is a plan view of the semiconductor acceleration sensor in FIG. 10A in a case where a cover is removed.

A semiconductor acceleration sensor 11 according to an eighth embodiment has a first adhesive film 71 between the sensor chip 12 and the circuit chip 13, as shown in FIG. 9. The first adhesion film 71 is a soft adhesion member for attaching the sensor chip 12 and the circuit chip 13. In addition, a second adhesion film 72 is provided on a lower surface of the sensor chip 12. The adhesion film 72 is a soft adhesion member made of the same material as the first adhesion film 71.

The first adhesion film 71 is made of a film (NCF) which has an electric insulation and an adhesiveness, e.g., a polyimide-based resin. The first adhesion film 71 has through holes through which the bumps 29 and dummy bumps 31 are disposed, and a concave part 71a provided on its lower surface. The concave part 71a are located to have gap with an upper surface of the acceleration detector 15, i.e., the movable electrode part 16, the first fixed electrode part 17, and the second fixed electrode part 18.

In the sensor chip 11 in FIG. 9, the similar effects with those of the sensor chip 11 in FIG. 2 can be obtained. In addition, the first adhesion film 71 enhances the strength of the connection between the sensor chip 12 and the circuit chip 13, and restricts the warp of the sensor chip 12. Furthermore, the adhesion films 71 and 72, which cover the upper surface and the rear surface of the sensor chip 12, restrict the warp of the sensor chip 12.

(Other Embodiments)

For example, the capacitive semiconductor is used for the semiconductor acceleration sensor 11, as shown in FIGS. 1A-9. Alternatively, the capacitive semiconductor sensor having a detection axis in one direction can be used for various applications.

Alternatively, a plurality of sensor chips may be mounted on one circuit chip, or a plurality of circuit chips may be mounted on one package. In addition, a plurality of the above-described embodiments may be combined. Further, a shape of a package, a position and a number of bumps, and a material for each component may be changed.

Such changes and modifications are to be understood as being within the scope of the present invention as defined by the appended claims.

What is claimed is:

1. A capacitive semiconductor sensor, comprising:
   a sensor chip including a dynamic quantity detector, which has a detection axis in one direction;
   a circuit chip including a signal processing circuit;
   a plurality of bumps, through which the sensor chip and the circuit chip are coupled by flip-chip bonding; and
   a plurality of dummy bumps, through which the sensor chip and the circuit chip are mechanically coupled,
   wherein the plurality of bumps and the plurality of dummy bumps are arranged in such a manner that when an approximately center portion of the dynamic quantity detector of the sensor chip is set to be an origin and the detection axis is set to be a Y-axis and a direction approximately perpendicular to the Y-axis is set to be an X-axis, a total amount of distances from the origin to the plurality of bumps and the plurality of dummy bumps in a direction of the X-axis is larger than a total amount of distances from the origin to the plurality of bumps and the plurality of dummy bumps in a direction of the Y-axis.

2. The capacitive semiconductor sensor according to claim 1, wherein:
   the plurality of bumps includes first to fourth bumps;
   the first bump and the second bump are arranged on the Y-axis so that the origin is located between the first bump and the second bump;
   the third bump and the fourth bump are arrange on the X-axis so that the origin is located between the third bump and the fourth bump;
   the plurality of dummy bumps includes four dummy bumps arranged at four corners of a quadrangle,
   the quadrangle has four sides; and
   each of the first to fourth bumps is located at an approximately center portion of the side of the quadrangle.

3. The capacitive semiconductor sensor according to claim 1, wherein:
   the plurality of bumps includes first to fourth bumps;
   the first bump and the second bump are arranged on the Y-axis so that the origin is located between the first bump and the second bump;

the third bump and the fourth bump are arrange on the X-axis so that the origin is located between the third bump and the fourth bump; and the plurality of dummy bumps is arranged in such a manner that when a first and second lines are set to be approximately parallel to the X-axis and the first line passes through the first bump and the second line passes through the second bump, the plurality of dummy bumps is located between the first line and the second line.

4. The capacitive semiconductor sensor according to claim 1, wherein:

the plurality bumps includes first to fourth bumps;

the first bump and the second bump are arranged on the Y-axis so that the origin is located between the first bump and the second bump;

the third bump and the fourth bump are arrange on the X-axis so that the origin is located between the third bump and the fourth bump; and the plurality of dummy bumps includes a plurality of third dummy bumps and a plurality of fourth dummy bumps which are arranged in such a manner that when third and fourth lines are set to be approximately parallel to the Y-axis and the third line passes through the third bump and the fourth line passes through the fourth bump, the plurality of third dummy bumps is arranged along the third line, and the plurality of fourth dummy bumps is arranged along the fourth line.

5. The capacitive semiconductor sensor according to claim 1, wherein:

the plurality of bumps and the plurality of dummy bumps are arranged to be approximately line symmetry with respect to the Y-axis and approximately point symmetry with respect to the origin.

6. The capacitive semiconductor sensor according to claim 1, wherein:

the sensor chip has an approximately square shape having four sides;

the plurality of bumps is arranged at one side of the approximately square shape; and the plurality of dummy bumps is arranged at other side of the approximately square shape.

7. The capacitive semiconductor sensor according to claim 1, further comprising:

a first soft adhesive member, wherein:

the sensor chip has a first surface and a second surface, and the first surface is located toward the circuit chip; and the first soft adhesive member is disposed between the first surface of the sensor chip and the circuit chip for attaching the sensor chip to the circuit chip.

8. The capacitive semiconductor sensor according to claim 7, further comprising:

a second soft adhesive member disposed on the second surface of the sensor chip, wherein:

the first and second soft adhesive members are made of the same material.

9. The capacitive semiconductor sensor according to claim 1, further comprising:

a test circuit arranged in the circuit chip for checking an electric property between the plurality of dummy bumps.

10. A capacitive semiconductor sensor, comprising:

a sensor chip including a dynamic quantity detector, which has a detection axis in one direction;

a circuit chip including a signal processing circuit;

a plurality of bumps, through which the sensor chip and the circuit chip are coupled by flip-chip bonding; and a plurality of dummy bumps, through which the sensor chip and the circuit chip are mechanically coupled, wherein:

the plurality of bumps includes first to fourth bumps;

the first and second bumps are arranged in a direction of the detection axis so that an approximately center portion of the dynamic quantity detector is located between the first bump and the second bump;

the third and fourth bumps are arranged in a direction approximately perpendicular to the detection axis so that an approximately center portion of the dynamic quantity detector is located between the third bump and the fourth bump;

the plurality of dummy bumps includes first to eighth dummy bumps;

the first to fourth dummy bumps are arranged at four corners of a quadrangle having first to fourth sides;

each of the first to fourth bumps is located at an approximately center portion of each of the first to fourth sides;

the fifth and sixth dummy bumps are arranged at approximately center portions between the third bump and the two corners on the third side of the quadrangle; and the seventh and eighth dummy bumps are arranged at approximately center portions between the fourth bump and the two corners on the fourth side of the quadrangle, wherein the plurality of bumps and the plurality of dummy bumps are arranged in such a manner that when an approximately center portion of the dynamic quantity detector of the sensor chip is set to be an origin and the detection axis is set to be a Y-axis and a direction approximately perpendicular to the Y-axis is set to be an X-axis, a total amount of distances from the origin to the plurality of bumps and the plurality of dummy bumps in a direction of the X-axis is larger than a total amount of distances from the origin to the plurality of bumps and the plurality of dummy bumps in a direction of the Y-axis.

11. The capacitive semiconductor sensor according to claim 1, wherein each of the plurality of bumps is disposed close to a center portion of a side portion of the sensor chip, and each of the plurality of dummy bumps is disposed close to a corner portion of the sensor chip.

12. The capacitive semiconductor sensor according to claim 11, wherein each of the plurality of bumps is disposed only at the center portion of the side portion of the sensor chip.

13. The capacitive semiconductor sensor according to claim 11, wherein a total amount of distances from the origin to the plurality of bumps in the direction of the X-axis is equal to a total amount distances from the origin to the plurality of bumps in the direction of the Y-axis.

14. A capacitive semiconductor sensor, comprising:

a sensor chip including a dynamic quantity detector, which has a detection axis in one direction;

a circuit chip including a signal processing circuit;

a plurality of bonding bumps, through which the sensor chip and the circuit chip are coupled by flip-chip bonding; and a plurality of dummy bumps, through which the sensor chip and the circuit chip are mechanically coupled, wherein the plurality of bonding bumps and the plurality of dummy bumps are arranged in such a manner that when an approximately center portion of the dynamic quantity detector of the sensor chip is set to be an origin and the detection axis is set to be a Y-axis and a direction approximately perpendicular to the Y-axis is set to be an X-axis, a sum of first distances from the Y-axis to the plurality of bonding bumps and the plurality of dummy bumps in a direction of the X-axis is larger than a sum of second distances from the X-axis to the plurality of bonding bumps and the plurality of dummy bumps in a direction of the Y-axis.

* * * * *